(12) United States Patent
Pinter et al.

(10) Patent No.: US 6,462,392 B1
(45) Date of Patent: Oct. 8, 2002

(54) MICROMECHANICAL CAP STRUCTURE AND THE RESPECTIVE MANUFACTURING METHOD

(75) Inventors: Stefan Pinter, Reutlingen; Harald Emmerich, Laupheim; Hans-Peter Trah, Stuttgart; Helmut Baumann, Gomaringen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/776,839

(22) Filed: Feb. 5, 2001

(30) Foreign Application Priority Data

Feb. 4, 2000 (DE) .......................................... 100 04 964

(51) Int. Cl.⁷ ............................................... H01L 29/82
(52) U.S. Cl. .................... 257/420; 257/415; 257/418
(58) Field of Search .................................. 257/415, 417, 257/418, 419, 420

(56) References Cited

U.S. PATENT DOCUMENTS

| | | | | |
|---|---|---|---|---|
| 4,699,006 A | * | 10/1987 | Boxenhorn | |
| 5,723,790 A | * | 3/1998 | Andersson | ................ 73/514.01 |
| 6,201,283 B1 | * | 3/2001 | Lai et al. | ..................... 257/410 |
| 6,369,931 B1 | * | 4/2002 | Funk et al. | .................. 359/223 |

* cited by examiner

*Primary Examiner*—Ngân V. Ngô
(74) *Attorney, Agent, or Firm*—Kenyon & Kenyon

(57) ABSTRACT

A micromechanical cap structure and a corresponding manufacturing method are described, the cap structure having a substrate, in particular in the form of a wafer, having a cavity made therein. The cavity includes a bottom surface and two pairs of opposite parallel side wall sections. The cavity has at least one stabilizing wall section, which connects two side wall sections. This considerably increases the stability of the cap structure.

8 Claims, 2 Drawing Sheets

MICROMECHANICAL CAP STRUCTURE AND THE RESPECTIVE MANUFACTURING METHOD

FIELD OF THE INVENTION

The present invention relates to a micromechanical cap structure and a corresponding manufacturing method, the cap structure having a substrate, in particular in the form of a wafer, having a cavity made therein, the cavity having a bottom surface and two pairs of opposite parallel sidewall sections.

BACKGROUND OF THE INVENTION

Although it can be used in principle for any micromechanical component, the present invention and the underlying principle are elucidated in greater detail with reference to this known surface-mounted micromechanical rotational speed sensor.

FIG. 4 schematically shows a cross-section through a known micromechanical rotational speed sensor which has a conventional micromechanical cap structure.

In FIG. 4, reference symbol 1 denotes a silicon substrate, 2 denotes a lower oxide layer, 3 denotes a buried circuit board made of polysilicon, 4 denotes an upper oxide layer, 6 denotes a bond frame made of epitactical polysilicon, 7 denotes a bond pad made of aluminum, 9 denotes a seal glass, 10 denotes a silicon protective cap wafer having a cavity K, 100 denotes a silicon wafer, 20 denotes an oscillator, 30 denotes a comb structure, VS denotes a front side, and RS denotes a back side.

According to conventional technology, micromechanical structures, in particular on front side VS, are exposed from underneath the 10 μm thick polysilicon layer 6 by trenching and removal of the sacrificial layer (oxide 2, 4) underneath it. On the back side, silicon wafer 1 is subjected to deep etching.

Silicon wafer 1 is bonded to silicon protective cap wafer 10 through seal glass bonding at high-temperature and high pressure, the seal glass, i.e., glass solder 9, being applied on the cap wafer by the screen-printing method and subsequently sintered in a furnace process (prebake process).

Cavity K in silicon protective cap wafer 10 is produced by anisotropic micromechanical etching, for example, by a KOH wet etching method. Cavity K has an inverted truncated pyramid shape with (111) side surfaces and a (100) etching bottom.

For high-quality surface-mounted micromechanical rotational speed sensors, having low damping of the mechanical oscillator structure by media surrounded by gas, a low absolute pressure, i.e., vacuum encapsulation, is required.

A seal glass process has been developed in which gas encapsulation at less than 5 mbar is possible. This was achieved, among other things, by a largest possible volume of the cavity. It is furthermore advantageous to position the seal glass as far as possible from the inner edge of the cavity, which can be accomplished by outward-displaced screen printing.

However, narrow seal glass bonding, due to the outward-displaced screen printing, and a thin cap diaphragm with a high cavity volume reduce the stability of the capped chips for packing the mold, because a high pressure is produced during gluing onto the lead frame and during subsequent cooling due to the high hydrostatic pressure when pressing in the mold compound.

SUMMARY OF THE INVENTION

The micromechanical cap structure according to the present invention have the advantage compared to the known structure and the known method that increased stability of the bonded surface-mounted micromechanical component is possible, while good vacuum encapsulation and virtually unchanged outer chip dimensions are preserved.

The present invention provides reinforcement of the cap diaphragm without considerable volume limitations for the cavity and, as an alternative or additionally, provides a larger bonding surface at the chip corners without increasing the outer chip dimensions. This increases the stability of the sensor chip carrying such a cap for encapsulation in plastic mold housings.

The underlying idea of the present invention is that the cavity has at least one stabilizing wall section, which connects two side wall sections. The stabilizing wall section(s) may be located along the peripheral contour of the cap or may run on the bottom surface, thus dividing the cavity in a plurality of subcavities.

According to one preferred refinement, the cavity has a rectangular shape. Such a structure is easy to implement.

According to another preferred refinement, the cavity has two crossing stabilizing wall sections which run parallel to the side wall sections over the bottom surface. Such a supporting cross is very effective for stabilizing and is easy to manufacture.

According to another preferred refinement, the stabilizing wall section(s) are lowered with respect to the peripheral contour of the cavity. This has the advantage that no substantial space is lost in the cavity.

According to another preferred refinement, the cavity has two pairs of opposite parallel stabilizing wall sections along the peripheral contour of the cavity, which connect adjacent side wall sections so that the cavity has an octagonal shape, the internal angles preferably being equal to 135°.

According to another preferred refinement, the substrate is a silicon substrate, the bottom surface is a plane and the side wall sections are planes.

DETAILED DESCRIPTION

Figure 1:
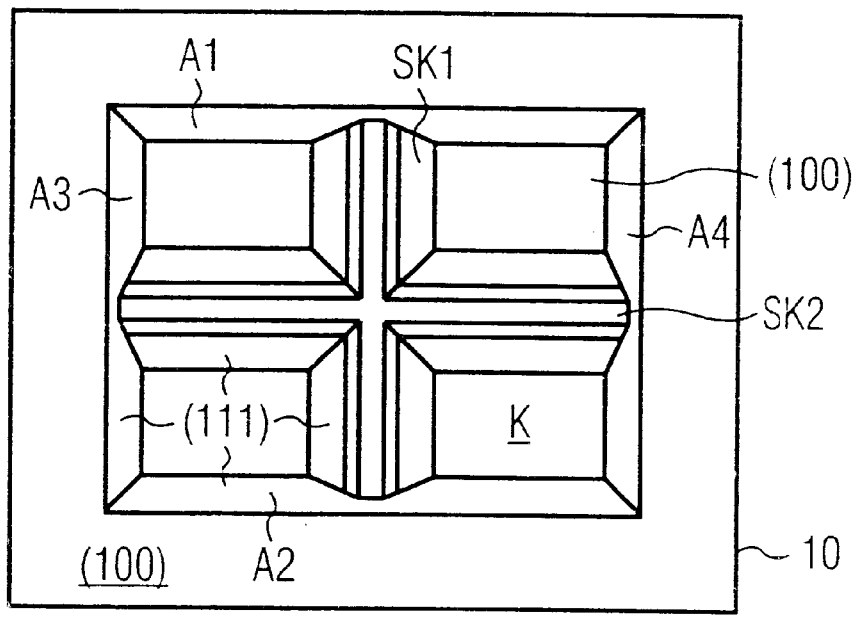
FIG. 1 schematically shows a cross-section of a first embodiment of the micromechanical cap structure according to the present invention.
Figure 2:
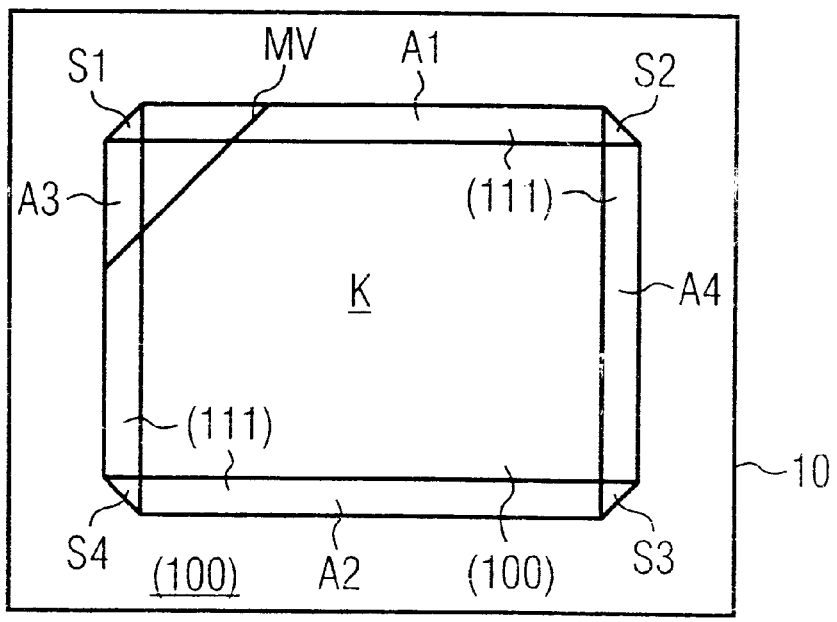
FIG. 2 schematically shows a cross-section of a second embodiment of the micromechanical cap structure according to the present invention.
Figure 3:
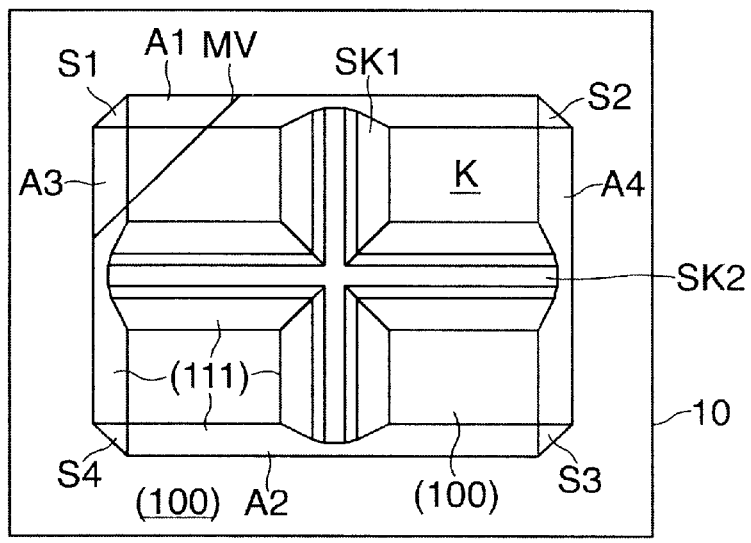
FIG. 3 schematically shows a cross-section of a third embodiment of the micromechanical cap structure according to the present invention.
Figure 4:
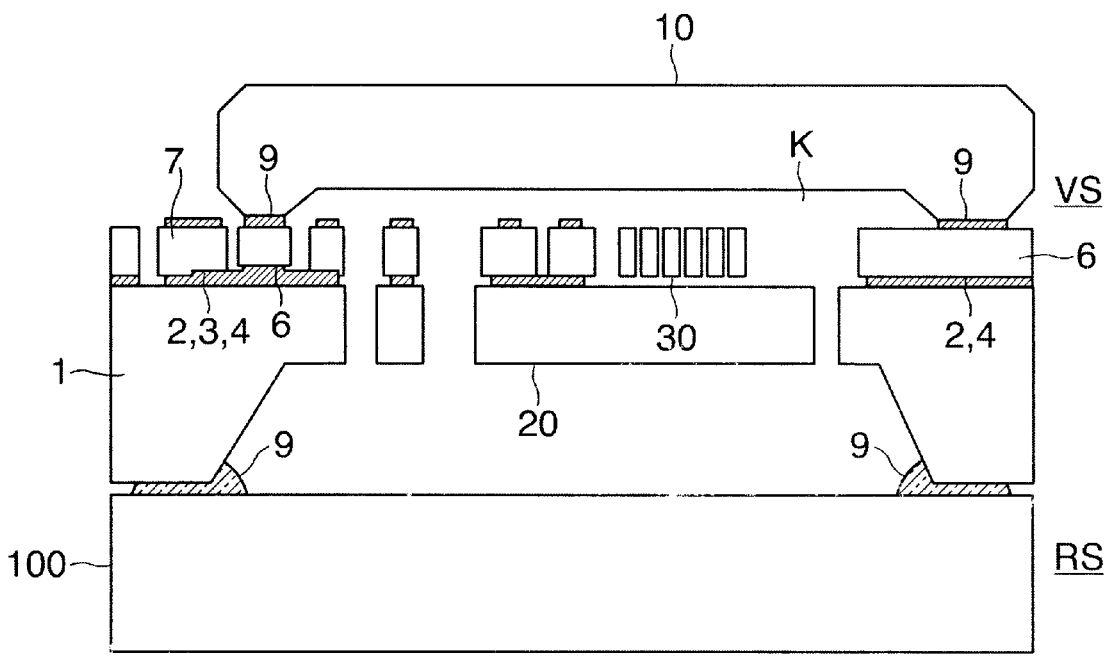
FIG. 4 schematically shows a cross-section of a known micromechanical rotational speed sensor having a conventional micromechanical cap structure.

In FIGS. 1 through 3, the same reference symbols as those in FIG. 4 denote the same components or components having the same functions.

FIG. 1 schematically shows a cross-section of a first embodiment of the micromechanical cap structure according to the present invention.

The micromechanical cap structure according to this first embodiment has a substrate 10 having a cavity K made therein. Cavity K has a rectangular bottom surface with two pairs of opposite parallel side wall sections. The substrate is a silicon substrate; the bottom surface is a (100) plane and side wall sections A1 through A4 are (111) planes.

In the first embodiment according to FIG. 1, local reinforcement of the diaphragm is achieved corresponding to the bottom surface of cavity K by a stabilizing cross with stabilizing bars SK1, SK2.

This increases membrane stability, i.e., the stability of the bottom surface of cavity K and the stability of the cap overall without substantially limiting the volume of cavity K, and thus the possible vacuum encapsulation.

The membrane reinforcement, i.e., stabilizing bars SK1, SK2 may be manufactured by the known micromechanical cap etching process, which is a two-stage KOH etching process.

As FIG. 1 shows, stabilizing cross SK1, SK2 is lowered with respect to the peripheral contour of the cavity. This is achieved by removing the passivating layer in the form of a hard resist, made, for example, of $SiO_2$, from stabilizing cross SK1, SK2 prior to the last KOH step. The stabilizing cross SK1, SK2 is then etched in the following KOH etching process. At the same time, it also becomes narrower through the etching, i.e., the original (111) edges are flattened and additional crystallographic surfaces appear, as indicated in FIG. 1.

This anisotropic etching behavior is well-known and may be taken into account in the layout of the resist. The appearance of the resulting reinforcing cross SK1, SK2 is shown in FIG. 1.

It is also possible to form a reinforcing web or reinforcing cross by etching two or four subcavities which together form the cavity volume for such a cap structure. The distance of the web or cross from the surface-mounted micromechanical structure is then only determined by the thickness of the glass solder. In other words, in such an embodiment, the reinforcing cross or reinforcing web is not lowered with respect to the cavity contour.

FIG. 2 schematically shows a cross-section through a second embodiment of the micromechanical cap structure according to the present invention.

In the embodiment according to FIG. 2, the cavity shape is approximated by an octagon of the outer contour, which is no longer rectangular. Such a geometry is useful for nonrectangular surface-mounted micromechanical structures such as, for example, torsional oscillator arrangements. In this design, the bonding surfaces are enlarged at the corners by introducing stabilizing wall sections S1–S4, which are vertical (010) planes. Simulations show that stresses in the seal glass are concentrated in that area. Therefore, considerable stabilization of the seal glass bond can be expected without changing the outer dimensions of the chip.

Such a structure can also be implemented in the conventional cap etching process. Four sidewalls A1–A4 of cavity K are formed as usual by the known (111) edges; the other four walls, i.e., stabilizing walls S1–S4 are formed by the vertical (010) planes. Since the etching rate of the (010) surfaces is well-known, namely it is equal to the etching rate of the cavity bottom surface, this structure can be easily taken into account in the layout of the resist, as shown by line MV in FIG. 2.

FIG. 3 schematically shows a cross-section through a third embodiment of the micromechanical cap structure according to the present invention.

The third embodiment according to FIG. 3 is a combination of the first and second embodiments, i.e., in addition to the supporting cross with supporting cross bars SK1, SK2, the four stabilizing walls S1–S4 are added, which lends optimal stability to this structure.

Although the present invention was described above with reference to preferred embodiments, it is not limited to those embodiments, but can be modified in many ways.

In particular, the protective layer according to the present invention can be used not only on micromechanical rotational speed sensors, but on any micromechanical components. The selection of materials for the individual layers is not limited to the materials mentioned herein. In particular, the present invention can be used not only for silicon components, but also for components made of other micromechanical materials.

Stabilization is, of course, not limited to the shapes described above, but can be achieved in any manner using stabilizing webs.

What is claimed is:

1. A micromechanical cap structure, comprising:
   a substrate including a cavity, the cavity including a bottom surface and two pairs of opposite, parallel side wall sections, wherein:
   the cavity includes at least one stabilizing wall section that connects two of the side wall sections to each other.

2. The micromechanical structure according to claim 1, wherein:
   the substrate includes a wafer.

3. The micromechanical cap structure according to claim 1, wherein:
   the cavity has a rectangular shape.

4. The micromechanical cap structure according to claim 1, wherein:
   the at least one stabilizing wall section includes two crossing stabilizing wall sections that run parallel to the side wall sections over the bottom surface.

5. The micromechanical cap structure according claim 1, wherein:
   the at least one stabilizing wall section is lowered with respect to a peripheral contour of the cavity.

6. The micromechanical cap structure according to claim 1, wherein:
   the at least one stabilizing wall section includes two pairs of opposite parallel stabilizing wall sections arranged along a peripheral contour of the cavity and connecting adjacent side wall sections to provide an octagonal shape to the cavity.

7. The micromechanical cap structure according to claim 6, wherein the octagonal shape includes internal angles equal to 135°.

8. The micromechanical cap structure according to claim 1, wherein:
   the substrate corresponds to a silicon substrate,
   the bottom surface includes a plane, and
   the side wall sections are planes.

* * * * *